Figure 2:
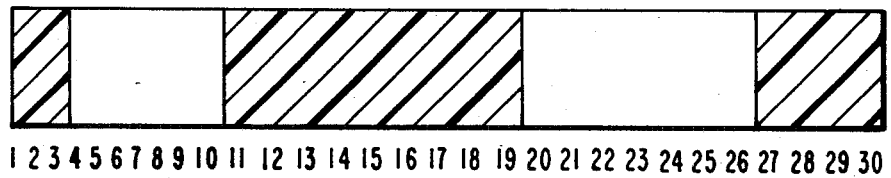

United States Patent [19]

Grossa

[11] Patent Number: 4,595,651

[45] Date of Patent: Jun. 17, 1986

[54] PROCESS FOR PRODUCING EQUIDENSITY IMAGES USING PHOTOHARDENABLE MATERIALS

[75] Inventor: Mario Grossa, Dreieich, Fed. Rep. of Germany

[73] Assignee: E. I. Du Pont de Nemours and Company, Wilmington, Del.

[21] Appl. No.: 647,809

[22] Filed: Sep. 6, 1984

[30] Foreign Application Priority Data

Sep. 29, 1983 [DE] Fed. Rep. of Germany ....... 3335309

[51] Int. Cl.$^4$ ............................ G03C 5/00; G03C 5/16
[52] U.S. Cl. ..................................... 430/394; 430/917; 430/326; 430/328
[58] Field of Search ................. 430/917, 394, 326, 328

[56] References Cited

U.S. PATENT DOCUMENTS

| | | | |
|---|---|---|---|
| 3,556,794 | 1/1971 | Margerum | 430/328 |
| 3,901,705 | 8/1975 | Pazos | 430/326 |
| 4,029,505 | 6/1977 | Nebe | 430/326 |
| 4,050,942 | 9/1977 | Nacci | 430/328 |
| 4,269,933 | 5/1981 | Pazos | 430/291 |
| 4,477,556 | 10/1984 | Dueber et al. | 560/140 X |

OTHER PUBLICATIONS

A. S. H. Craeybeckx, compiler, "2496 continuous tone", *Elsevier's Dictionary of Photography in Three Languages: English, French and German*, Elsevier Publishing Company, New York, N.Y., 1965, p. 100.

*Polygraph Worterbuch Der Graphischen Industrie in Sechs Sprachen*, Polygraph Verlag GmbH, Frankfurt Am Main, 1967, p. 142, 2986 "Halbton" and 5115 "Rasterpunkt".

Dr. Ernst Lau and Dr. Wolfgang Krug, *Equidensitometry*, Focal Press, London and New York, p. 9.

*The Focal Encyclopedia of Photography*, McGraw-Hill Book Company, New York, N.Y., p. 345.

*Primary Examiner*—John E. Kittle
*Assistant Examiner*—Cynthia Hamilton

[57] ABSTRACT

Process for photographic recording of selective areas of an original image, e.g., as equidensities and/or contour images, on a photohardenable material, e.g., (a) nongaseous monomer compound, (b) organic photoinitiator or photoinitiator/sensitizer system and (c) photoinhibitor activatable by ultraviolet radiation, which comprises in either order (A) exposing the photohardenable layer with desensitizing radiation, and (B) photohardening the layer with photohardening radiatiion, exposures (A) and (B) being imagewise exposures with the proviso that if exposure (B) is the first imagewise exposure, a nonimagewise final exposure is utilized.

6 Claims, 2 Drawing Figures

F I G. 1
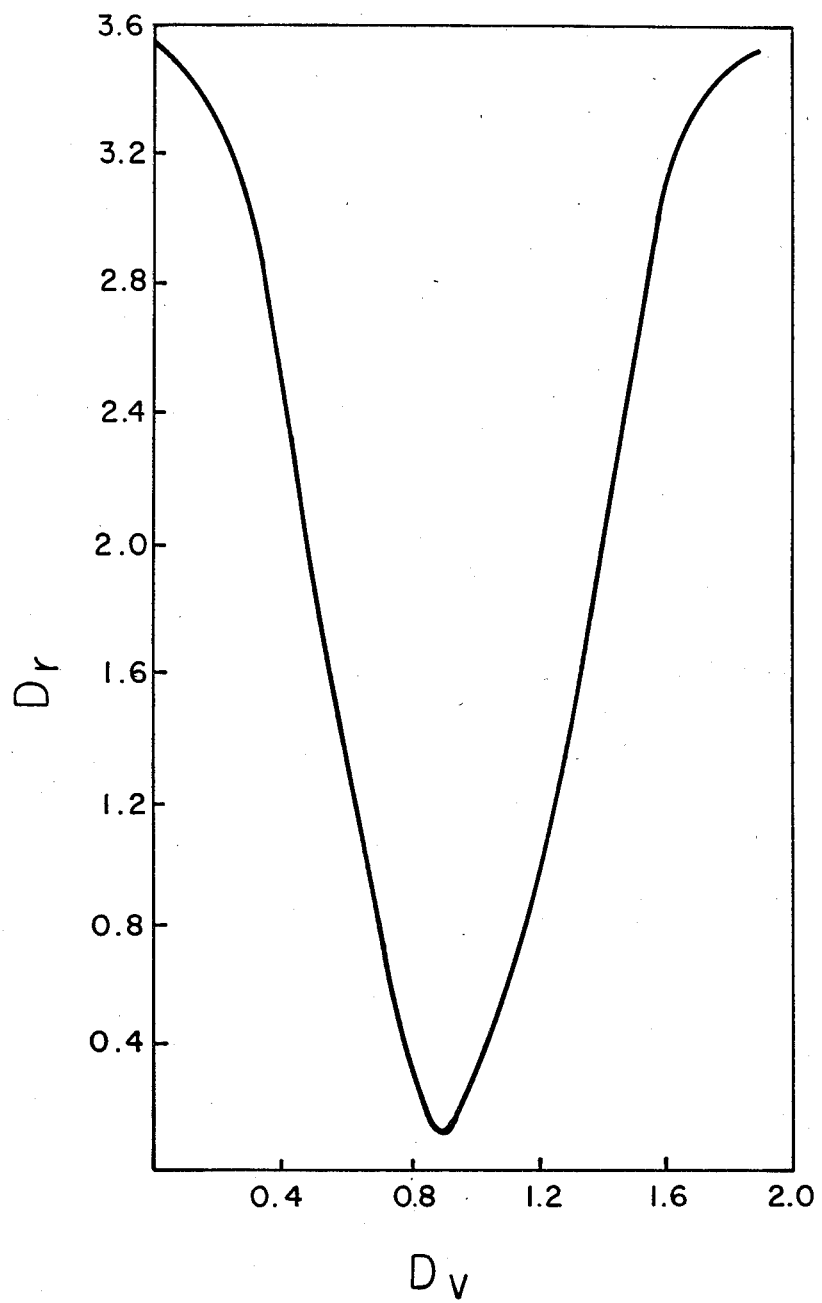

PROCESS FOR PRODUCING EQUIDENSITY IMAGES USING PHOTOHARDENABLE MATERIALS

DESCRIPTION

1. Technical Field

This invention relates to a process for photographic recording of selective areas of an original image on a photohardenable material. More particularly this invention relates to a process for the recording of equidensities and contour images using photohardenable materials desensitized with radiation of a given wavelength range and photohardened by radiation of another wavelength range.

2. Background Art

The term "equidensities" as used throughout the specification means lines of equal optical density of a continuous tone original. Equidensities are used to represent the density distribution in photographic exposures as well as the brightness distribution in a photographed object. Examples of application are in X-ray photographs, aerial photographs or photographs for astronomy. Contour images are also known as the second derivative of equidensities. Methods for the production of such equidensity images are described, for example, in "Equidensitometry" by E. Lau and G. Krug, The Focal Press, London and New York, 1968. Up to now photographic film materials containing silver halide were used exclusively for this. Thus, for example, the difficult to reproduce Sabattier-effect has been used for the production of equidensity images in which an image reversal was obtained by a second, nonimagewise exposure after the partial development of an imagewise exposed photographic layer.

A process for the photographic production of black and white equidensities using a bromine ion diffusion process is known from U.S. Pat. No. 3,637,388 where a mixed emulsion comprising silver chloride and silver bromide is used. The processing of such materials requires special developers. The production of contour images requires a repetition of the copying process with the equidensity image obtained in the first step.

German OS No. 3,144,021 discloses a process for the production of color equidensities using a color diffusion process, which comprises a negative silver halide emulsion and a combination of a reducible dye releasing compound associated electron donor.

The production of several equidensities of different density areas of the original image requires with all known processes cumbersome copying processes. Moreover, none of the mentioned processes makes it possible to produce relief images without using additional and difficult to reproduce processing steps.

There is a need to provide processes, according to which selective areas of an original image, e.g., equidensities of a continuous tone original or contour images of a line original, are recorded on a silver-free material and can be made visible using a simple and quick developing process. There is a further need to reproduce the equidensities on known photohardenable materials selectively as "negative" or "positive" black and white, color, or relief images and to provide a process according to which several equidensities can be recorded on the same layer.

FIGURE OF THE INVENTION

In the accompanying drawings forming a material part of this disclosure, FIG. 1 is a density pattern of the negative equidensity image illustrated in FIG. 9.

FIG. 2 illustrates the formation of two equidensities as "negative" relief corresponding to the density ranges of Example 7.

DISCLOSURE OF THE INVENTION

In accordance with this invention, there is provided a process for photographic recording of selective areas of an original image on a layer of photohardenable material comprising (a) a nongaseous, ethylenically unsaturated monomeric compound, (b) an organic photoinitiator or photoinitiator/sensitizer system sensitive in visible light, and (c) a photoinhibitor activatable by ultraviolet radiation taken from the class consisting of nitroso dimers and o-nitroaromatic compounds, the process comprising, in either order, (A) exposing the photohardenable layer with radiation of a wavelength range which desensitizes the exposed areas, (B) photohardening the layer by exposure with radiation of a wavelength range which hardens the layer, the improvement wherein recording of the image is accomplished by two imagewise exposures with radiation of different wavelengths (A) and (B), with the proviso that when the first imagewise exposure is the photohardening exposure a nonimagewise photohardening final exposure follows the second imagewise exposure.

Photohardenable materials which are suitable for carrying out the process of the invention are described in U.S. Pat. Nos. 3,556,794, 3,901,705, 4,029,505, 4,269,933, etc., the disclosures of which are incorporated by reference. The photohardenable layer comprises:

(a) nongaseous, ethylenically unsaturated compounds capable of radical chain polymerization,
(b) an organic photoinitiator sensitive in visible light, or preferably a photoinitiator/sensitizer system which initiates photopolymerization in visible light,
(c) a photoinhibitor activatable by ultraviolet radiation, e.g., nitroso-dimers or o-nitroaromatic compounds.

Such materials are normally used for the production of positive relief images, e.g., first there is an imagewise photoinhibition exposure using ultraviolet radiation and next photohardening by a nonimagewise exposure using visible light. In this way, after a wash-off development, a positive image of the original is formed. Depending on the state of the absorption maximum of the photoinhibitors and photoinitiators, other wavelengths can also be used for exposure. Thus, when using nitroso-dimers, shortwave ultraviolet radiation <340 nm can be used for the imagewise inhibition exposure, and longwave ultraviolet radiation of 340 to 400 nm for polymerization of the nonimagewise exposed areas. Materials and a process are known from U.S. Pat. No. 3,784,378, where a first imagewise exposure with light of >450 nm is carried out, which leads to exhaustion of the hydrogen donor of the photopolymerization system. A second, nonimagewise exposure with light of <450 nm brings about a polymerization in the areas which did not receive any imagewise exposure. Also the photohardenable materials used here can be used for carrying out the process of the invention. While, however, all processes of the start of the art only use an imagewise exposure and produce a positive image of the original, in contrast to this with the process of the invention, two imagewise exposures are carried out, whereby, depending on the type of original, equidensities or contour images are formed. Moreover, it is even possible by repetition with increasing exposure to obtain several equidensities on a photohardenable layer. Using the example of a material which releases an inhibitor with ultraviolet exposure and is photopolymerized by visible light, the following embodiments of the process are set forth:

(A) In the event that equidensities are to be produced using a continuous tone original, then the first imagewise exposure is carried out through an original using ultraviolet radiation and the second imagewise exposure is carried out through an original with visible light. Development by toning with colored powder produces a bright equidensity on a dark background. Wash-off development produces a relief-like elevated (positive) equidensity.

(B) In the event that the equidensity is to be represented as a dark image on a bright background or as a "negative" relief, the first imagewise exposure is carried out with visible light and the second imagewise exposure is carried out with ultraviolet radiation. A final nonimagewise exposure to visible light is used followed by development either by toning with colored powder or by wash-off development.

(C) In the event that several equidensities are to be recorded, then the two imagewise exposures according to embodiments (A) or (B) are repeated one or more times with respectively increasing exposure, before the nonimagewise final exposure described in embodiment (B) is carried out. The exposed layers are selectively toned with colored powder or are subjected to wash-off development.

(D) In the event a lined copy is to be converted to a contour image of lines of an original and the contour images are "positive" reliefs or bright image on a dark background, then a first imagewise exposure is carried out with collimated ultraviolet radiation and a second imagewise exposure is carried out with diffused visible light, i.e., necessary light scattering can be achieved either with a suitable light source and/or with a transparent or preferably scattering film of about 25 to 200 µm in thickness placed between the original and the photosensitive layer. Development can be by wash-off development or by toning with a colored powder.

(E) In the event opposite images from embodiment (D) are to be recorded, i.e., "negative" relief contours or dark contour images on a bright background, the first imagewise exposure is carried out with collimated visible light through the original, and the second imagewise exposure is carried out with diffused ultraviolet radiation. The final exposure is a nonimagewise exposure with visible light. Development can be by wash-off development and/or toning with a colored powder.

Depending on the particular composition of the photohardenable layer, the following solutions are suited as wash-off solutions for making visible the recorded latent images. Aqueous-alkali solutions, e.g., contain alkali-carbonates or -bicarbonates, alkaliphosphates or alkalimetasilicates; organic solvents, e.g., acetic ester, methylene chloride, etc.; or also combinations of aqueous-alkali solutions with water soluble organic solvents, such as aliphatic alcohols. As toners, colored powders or compositions, as they are described, e.g., in U.S. Pat. Nos. 3,620,726, 4,304,843, 4,397,941, etc. are suitable, the disclosures of which are incorporated by reference.

Conventional light sources can be used for exposure which emit in suitable wavelength ranges. Argon lights, electronic flashes, photographic flood lights and tungsten-quartz iodine lamps are especially suited for the visible range. Undesired ultraviolet radiation is eliminated by suitable filters. Mercury vapor lamps, fluorescent lights with luminous substances which emit ultraviolet radiation, or xenon lamps where the undesired visible light is filtered out by suitable filters are suitable for the ultraviolet range. By suitable selection of lighting conditions during imagewise exposure with visible light and ultraviolet radiation, as well as during nonimagewise after-exposure with visible light, the width of the equidensities can be controlled. This is illustrated in Tables 1, 2 and 3 of Example 1 below.

INDUSTRIAL APPLICABILITY

Photohardenable materials as disclosed above are useful for forming one or more equidensities on their surface. The equidensities can be a bright equidensity on a dark background or a dark equidensity on a bright background. Contour reliefs can also be formed with a variation in the process. The contour reliefs can be a bright image on a dark background or a dark image on a bright background. The process is particularly useful in the preparation of printed circuits.

EXAMPLES

The invention is illustrated by the following examples wherein the percentages are by weight. The molecular weights of polymeric compounds are weight average molecular weights ($\overline{Mw}$). The $\overline{Mw}$ of the polymers can be determined by using a light scattering technique using known standard samples, e.g., polystyrene, polymethacrylic acid, polymethylmethacrylate, etc. as known to those skilled in the art.

EXAMPLE 1

A 25 µm thick photohardenable film of the following composition is produced on a 35 µm thick polyethylene terephthalate substrate by casting a methylene chloride solution having a 25% solid content:

| | |
|---|---|
| Polyvinyl acetate | 12.6% |
| Polymethyl methacrylate | 31.1% |
| Trimethylol propane trimethacrylate | 35.6% |
| Triacrylate of oxethylated trimethylol propane | 8.0% |
| Oxethylated hexadecanol | 8.0% |
| Dimer of 2-(o-chlorophenyl)-3,4-diphenyl imidazole | 1.6% |
| 2-Mercaptobenzoxazole | 0.8% |
| Inhibitor indicator compound (A) | 2.0% |

Sensitizer (B) 0.3%

(A)

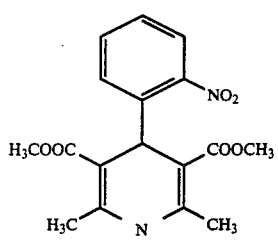

(B)

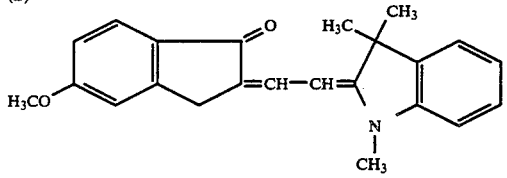

The obtained film is laminated with the layer side onto white paper at ca. 100° C. and is exposed through a continuous tone wedge with a wedge constant of $\sqrt[3]{2}$ corresponding to the time in Tables 1, 2 and 3 below with visible light and ultraviolet radiation. A 2000 W tungsten-quartz iodine lamp with a filter for radiation under 400 nm is used as the light source for visible light. Exposure with ultraviolet radiation is carried out with a 1000 W mercury lamp through a filter for light over 400 nm. The lamp distance from the photohardenable layer with both radiation sources is 60 cm. For the final exposure with visible light, the continuous tone cover sheet is removed, and the 2000 W tungsten-quartz iodine lamp is used with a filter for radiation under 400 nm. After exposure the polyethylene terephthalate substrate is removed, and the layer on the white paper is toned with a black toner described in U.S. Pat. No. 3,620,726. The following results are obtained:

TABLE 1

| 1st Exposure (seconds) $\lambda = 400-700$ nm (imagewise) | 2nd Exposure (seconds) $\lambda = 300-400$ nm | 3rd Exposure (seconds) $\lambda = 400-700$ nm (nonimagewise) | Density of Original $D_1$ | $D_2$ |
|---|---|---|---|---|
| 10 | 90 | 15 | 0.2 | 1.9 |
| 15 | 90 | 15 | 0.3 | 1.9 |
| 20 | 90 | 15 | 0.5 | 1.9 |
| 25 | 90 | 15 | 0.6 | 2.0 |

$D_1$ indicates the density of the original up to which the layer is no longer tonable.
$D_2$ is the density limit above which the layer is no longer tonable.
$D_2-D_1$ is a criterion for the width of the equidensities.

Table 1 indicates that the density limit $D_1$ and thus the width of the equidensities can be controlled with increasing imagewise exposure with visible light (first exposure).

TABLE 2

| 1st Exposure (seconds) $\lambda = 400-700$ nm (imagewise) | 2nd Exposure (seconds) $\lambda = 300-400$ nm | 3rd Exposure (seconds) $\lambda = 400-700$ nm (nonimagewise) | Density of Original $D_1$ | $D_2$ |
|---|---|---|---|---|
| 15 | 60 | 15 | 0.3 | 1.7 |
| 15 | 90 | 15 | 0.3 | 1.9 |
| 15 | 120 | 15 | 0.3 | 2.1 |
| 15 | 150 | 15 | 0.3 | 2.2 |

Table 2 indicates that the density limit $D_2$ can be controlled with increasing imagewise exposure with ultraviolet light (second exposure).

TABLE 3

| 1st Exposure (seconds) $\lambda = 400-700$ nm (imagewise) | 2nd Exposure (seconds) $\lambda = 300-400$ nm | 3rd Exposure (seconds) $\lambda = 400-700$ nm (nonimagewise) | Density of Original $D_1$ | $D_2$ |
|---|---|---|---|---|
| 15 | 150 | 15 | 0.3 | 2.2 |
| 15 | 150 | 20 | 0.5 | 1.9 |

It is clear from Table 3, that the width of the equidensities decreases with increasing final exposure with visible light (third exposure).

EXAMPLE 2

The photohardenable material laminated onto white paper and described in Example 1 is first imagewise exposed through a 30 step gray wedge with a wedge constant of 0.1 with ultraviolet radiation (30 seconds) and subsequently through the same gray wedge with visible light (120 seconds). The radiation sources described in Example 1 were used.

After removal of the polyethylene terephthalate substrate, the layer on the white paper is toned with a toner described in U.S. Pat. No. 3,620,726 whereby a bright ("negative") equidensity on a dark background remains untoned between the densities 0.6 and 1.6.

EXAMPLE 3

The contour image of a line original is prepared as described in Example 1 using a similar photohardenable material laminated onto white paper and similar radiation source. The following conditions apply:

(1) the photohardenable layer is exposed for 15 seconds imagewise with visible light,
(2) between the line original and the photohardenable layer light scattering film of 100 μm in thickness is placed, and the ultraviolet image exposure is of 240 seconds duration, and
(3) after removal of the cover sheet there is a nonimagewise exposure of 30 seconds with visible light. The necessary registration during the first and second imagewise exposures is achieved by using conventional registering instruments. After toning the tacky image portions with a toner described in U.S. Pat. No. 3,620,726 a contour image of the line original is obtained.

EXAMPLE 4

A 25 μm thick film layer of the following composition is prepared on a 25 μm thick polyethylene terephthalate substrate by casting a methylene chloride solution having a 25% solid content:

| Copolymer with an $\overline{M}w$ of ca. 50,000 comprising | |
|---|---|
| 40% tert.-octyl acrylamide, | 53.6% |
| 25% methyl methacrylate, | |
| 15% hydroxypropyl methacrylate, | |
| 16% acrylic acid and | |
| 4% tert.-butyl aminoethyl methacrylate | |
| Terpolymer with an $\overline{M}w$ of ca. 260,000 comprising | |
| 56% ethyl acrylate | 3.8% |
| 37% methyl methacrylate and | |
| 7% acrylic acid | |
| Trimethylol propane triacrylate | 23.0% |
| Triethylene glycol dimethacrylate | 8.0% |
| Tetraethyleneglycol dimethacrylate | 4.0% |
| Dimer of 2-(o-chlorophenyl)-3,4-diphenyl imidazole | 5.0% |
| Compound A from Example 1 | 1.9% |
| Leuco Crystal Violet, Basic Violet 3, C.I. No. 42553 | 0.25% |
| Compound B from Example 1 | 0.35% |
| Victoria Pure Blue BO, C.I. No. 42595 (C.I. Basic Blue 7) | 0.1% |

The photohardenable material is laminated onto a copper foil-clad substrate for printed circuits and is exposed through a line original as described in Example 3. Subsequently it is developed for 90 seconds in an aqueous sodium carbonate solution (1%) at 20° C. and the nonpolymerized material is washed off with water. A contour image of the line original is formed where the contours are formed as "negative" relief (depressions).

EXAMPLE 5

The photohardenable material described in Example 4 and laminated onto a copper-clad substrate is exposed through a continuous tone cover sheet for 30 seconds with visible light, 135 seconds with ultraviolet radiation and finally without a cover sheet for 30 seconds with visible light. A light with 4 40 W fluorescent tubes with an emission maximum at 450 nm without an ultraviolet portion is used as the light source for the visible light at a distance between the photohardenable layer and the light tubes of 20 cm. For the ultraviolet exposure the mercury vapor lamp described in Example 1 with a filter is used. Subsequently the polyethylene terephthalate substrate is removed and the exposed layer on the copper-clad substrate is developed at 20° C. for 70 seconds using a 1% aqueous sodium carbonate solution. After rinsing with water the density range remains below an original density of 0.8 and above 1.3, so that a "negative" equidensity relief is formed on the copper substrate.

EXAMPLE 6

The photohardenable material laminated onto a copper-clad substrate and described in Example 4 is exposed using the radiation sources described in Example 1 through a continuous tone image for 45 seconds with ultraviolet radiation and subsequently 3 minutes through the same cover sheet with visible light.

After removal of the polyethylene terephthalate substrate, the exposed material is developed at 30° C. for 70 seconds with a 1% aqueous sodium carbonate solution and the nonpolymerized materials removed by rinsing with water. A "positive" equidensity relief image is formed on the copper substrate.

EXAMPLE 7

Example 5 is repeated whereby the exposures are according to the following Table 4. The imagewise exposure is repeated with 1, visible light, and 2, ultraviolet radiation, to record two equidensities, and after removal of the original there is a nonimagewise final exposure with visible light.

TABLE 4

| | $\lambda >$ 400 nm (seconds) Imagewise Exposure 1 | $\lambda <$ 400 nm (seconds) Imagewise Exposure 2 | |
|---|---|---|---|
| 1 | 7 | 60 | |
| 2 | 300 | 750 | |
| 3 | — | 20 | (without original) |

The polyethylene terephthalate film is removed and is developed for 1.5 minutes at 20° C. in a 1% sodium carbonate solution. After rinsing off the nonpolymerized image portions with water, two equidensities are formed as "negative" relief corresponding to the following density ranges:

polymerized material—wedge steps 1-3, 11-19, 27-30 rinsed out part: wedge steps 4-10, 20-26.

This is illustrated in FIG. 2.

EXAMPLE 8

The photohardenable material laminated onto a copper clad substrate and described in Example 4 is exposed through a line original for 45 seconds with ultraviolet radiation from the radiation source described in Example 1 at a distance of 60 cm and with a filter for $\lambda >$ 400 nm. Subsequently the material is exposed for 30 seconds with a light containing 5 tubes of 40 W each. (Emission maximum at 450 nm, no ultraviolet portion). The distance between the photohardenable layer and the cover sheet is 20 cm.

After removal of the polyethylene terephthalate film the exposed material is developed for 50 seconds in a 1% aqueous sodium carbonate solution at 30° C. and the nonpolymerized material is washed off with water whereby a contour image of the line original is formed as a "positive" relief.

EXAMPLE 9

A photopolymeric litho film of the following composition having a layer thickness of 8 μm is prepared on a 100 μm polyethylene terephthalate film substrate:

Terpolymer with a $\overline{M}w$ of ca. 260,000 comprising

| 56% ethyl acrylate | 20.9% |
|---|---|
| 37% methyl methacrylate and | |
| 7% acrylic acid | |
| Carbon black | 17.1% |
| Styrene/maleic acid copolymer (1:1), partially esterified with sec. butanol (Mw ca. 10,000) | 33.7% |
| Triethylene glycol dimethacrylate | 8.5% |
| Trimethylol propane triacrylate | 8.5% |
| 6-nitroveratraldehyde | 1.8% |
| Dimer of 2-(o-chlorophenyl)-3,4-diphenyl imidazole | 8.6% |
| Compound C | 0.9% |

Compound C

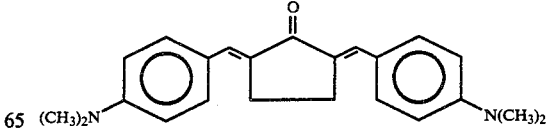

The film formed is covered with a 25 μm thick polyethylene terephthalate film and is exposed through a continuous tone wedge with the radiation source described in Example 1:

| 1st Exposure (seconds) $\lambda$ = 400–700 nm (imagewise) | 2nd Exposure (seconds) $\lambda$ = 300–400 nm | 3rd Exposure (seconds) $\lambda$ = 400–700 nm (nonimagewise) |
| --- | --- | --- |
| 180 | 25 | 30 |

An aqueous $K_2CO_3$ solution (5%) is used for development for 10 seconds at 25° C. Subsequently the unhardened image portions are rinsed off with a spray of water. A "negative" equidensity image is formed which exhibits the density pattern shown in FIG. 1 wherein Dr is resulting density and $D_v$ is the density of the original.

I claim:

1. A process for photographic recording of selective areas of an original image on a layer of photohardenable material comprising (a) a nongaseous, ethylenically unsaturated monomeric compound, (b) an organic photoinitiator or photoinitiator/sensitizer system sensitive in visible light, and (c) a photoinhibitor activatable by ultraviolet radiation taken from the class consisting of nitroso dimers and o-nitroaromatic compounds, the process comprising, in either order, (A) exposing the photohardenable layer with radiation of a wavelength range which desensitizes the exposed areas, (B) photohardening the layer by exposure with radiation of a wavelength range which hardens the layer, the improvement wherein recording of the image is accomplished by two imagewise exposures through the same original image with radiation of different wavelengths (A) and (B), with the proviso that when the first imagewise exposure is the photohardening exposure a nonimagewise photohardening final exposure follows the second imagewise exposure.

2. A process according to claim 1 wherein the imagewise exposures are carried out through a continuous tone original and the recorded selected ranges represent equidensities.

3. A process according to claim 2 wherein the two imagewise exposures are repeated one or more times with respectively increasing exposure.

4. A process according to claim 1 wherein the imagewise exposures are carried out through a line original whereby the first exposure is carried out with collimated radiation and the second exposure with diffused radiation, the recorded selective areas representing contour images.

5. A process according to claim 4 wherein the exposure with diffused radiation is carried out by placing between the original and the photohardenable material a scattering film, 25 to 200 μm in thickness.

6. A process according to claim 1 wherein the photohardening exposure is carried out with visible light of wavelength greater than 400 nm and the desensitizing exposure is carried out with radiation of wavelength of 250 to 400 nm.

* * * * *